United States Patent
Cheng et al.

(10) Patent No.: US 10,510,554 B2
(45) Date of Patent: *Dec. 17, 2019

(54) GUARD RING STRUCTURE OF SEMICONDUCTOR ARRANGEMENT

(71) Applicant: Taiwan Semiconductor Manufacturing Company Limited, Hsin-Chu (TW)

(72) Inventors: Sheng-Fang Cheng, New Taipei (TW); Chen-Chih Wu, Hsinchu (TW); Chien-Yuan Lee, Zhubei (TW); Yen-Lin Liu, Taichung (TW)

(73) Assignee: Taiwan Semiconductor Manufacturing Company Limited, Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/206,036

(22) Filed: Nov. 30, 2018

(65) Prior Publication Data

US 2019/0109014 A1 Apr. 11, 2019

Related U.S. Application Data

(60) Continuation of application No. 15/947,977, filed on Apr. 9, 2018, now Pat. No. 10,170,333, which is a continuation of application No. 15/463,213, filed on Mar. 20, 2017, now Pat. No. 9,941,141, which is a division of application No. 14/330,285, filed on Jul. 14, 2014, now Pat. No. 9,601,625.

(Continued)

(51) Int. Cl.
| | |
|---|---|
| *H01L 21/26* | (2006.01) |
| *H01L 21/3205* | (2006.01) |
| *H01L 29/78* | (2006.01) |
| *H01L 29/423* | (2006.01) |
| *H01L 29/06* | (2006.01) |
| *H01L 21/8234* | (2006.01) |
| *H01L 27/088* | (2006.01) |
| *H01L 21/265* | (2006.01) |
| *H01L 21/768* | (2006.01) |

(52) U.S. Cl.
CPC ...... *H01L 21/32051* (2013.01); *H01L 21/265* (2013.01); *H01L 21/32055* (2013.01); *H01L 21/76877* (2013.01); *H01L 21/823431* (2013.01); *H01L 27/0886* (2013.01); *H01L 29/0619* (2013.01); *H01L 29/0623* (2013.01); *H01L 29/0692* (2013.01); *H01L 29/423* (2013.01); *H01L 29/7851* (2013.01)

(58) Field of Classification Search
None
See application file for complete search history.

(56) References Cited

U.S. PATENT DOCUMENTS

5,438,005 A 8/1995 Jang
8,890,293 B2 11/2014 Lu et al.
(Continued)

*Primary Examiner* — Fernando L Toledo
*Assistant Examiner* — Valerie N Newton
(74) *Attorney, Agent, or Firm* — Cooper Legal Group, LLC (57) ABSTRACT

Among other things, one or more semiconductor arrangements and techniques for forming such semiconductor arrangements are provided. A semiconductor arrangement comprises a first guard ring surrounding at least a portion of a device, and a first poly layer formed over the first guard ring.

20 Claims, 8 Drawing Sheets

Related U.S. Application Data

(60) Provisional application No. 61/846,297, filed on Jul. 15, 2013.

(56) References Cited

U.S. PATENT DOCUMENTS

| | | | |
|---|---|---|---|
| 9,941,141 B2 * | 4/2018 | Cheng | ................ H01L 29/7851 |
| 2009/0294929 A1 | 12/2009 | Lee et al. | |
| 2010/0289110 A1 | 11/2010 | Tarui et al. | |
| 2013/0264676 A1 | 10/2013 | Yang et al. | |

* cited by examiner

GUARD RING STRUCTURE OF SEMICONDUCTOR ARRANGEMENT

RELATED APPLICATIONS

This application is a continuation of and claims priority to U.S. Non-Provisional application Ser. No. 15/947,977, titled "GUARD RING STRUCTURE OF SEMICONDUCTOR ARRANGEMENT" and filed on Apr. 9, 2018, which is a continuation of and claims priority to U.S. Non-Provisional application Ser. No. 15/463,213, titled "GUARD RING STRUCTURE OF SEMICONDUCTOR ARRANGEMENT" and filed on Mar. 20, 2017, which is a divisional of and claims priority to U.S. Non-Provisional application Ser. No. 14/330,285, titled "GUARD RING STRUCTURE OF SEMICONDUCTOR ARRANGEMENT" and filed on Jul. 14, 2014, which claims priority to U.S. Provisional Application 61/846,297, titled "GUARD RING STRUCTURE OF SEMICONDUCTOR ARRANGEMENT" and filed on Jul. 15, 2013. U.S. Non-Provisional application Ser. Nos. 15/947,977, 15/463,213, and 14/330,285 and U.S. Provisional Application 61/846,297 are incorporated herein by reference.

BACKGROUND

Guard rings are formed in semiconductor arrangements, such as integrated circuits, to provide electrical isolation, structural integrity, etc., for semiconductor devices of the semiconductor arrangements. A guard ring comprises one or more semiconductor regions surrounding a semiconductor device. The device generally comprises a layer or region of polysilicon (poly), such as in a gate structure of a transistor device. A guard ring does not, however, comprise poly. The existence of poly in the device but not in the guard ring results in non-uniform poly density between the guard ring and the device. The non-uniform density of poly between the guard ring and the device impacts fabrication of the semiconductor arrangement and, alternatively or in addition, affects operation of the semiconductor device.

DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more guard rings and techniques for forming guard rings are provided in various embodiments of the present disclosure. A guard ring is formed around at least a portion of a device of a semiconductor arrangement, such as a fin field effect transistor (FinFET) device or other metal-oxide-semiconductor (MOS) device. According to some embodiments, one or more layers of polysilicon (poly) are formed over one or more guard rings to promote poly uniformity between the one or more guard rings and the device.

Figure 1:
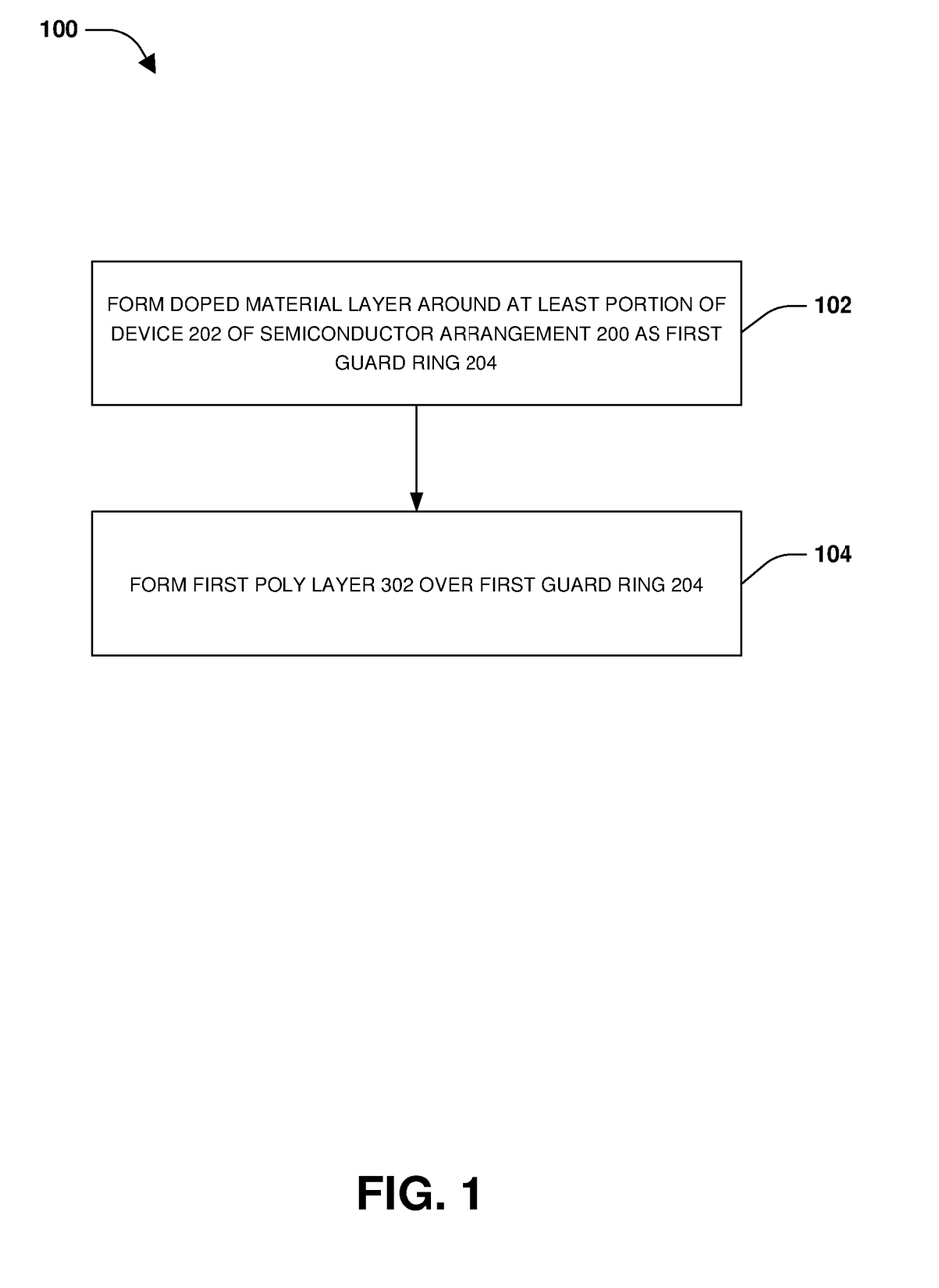
FIG. 1 is a flow diagram illustrating a method of forming a first guard ring, according to some embodiments.
Figure 2:
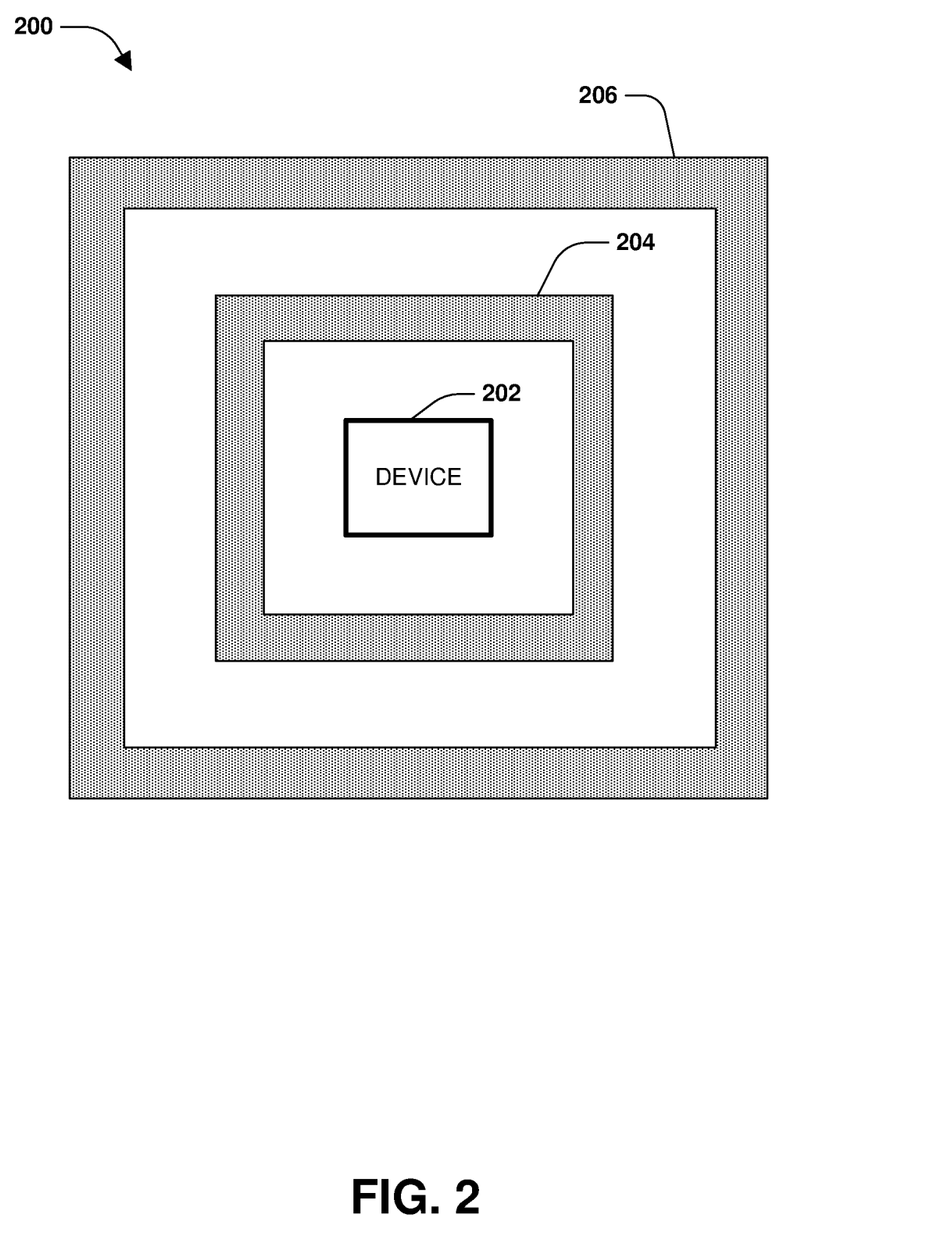
FIG. 2 is an illustration of a semiconductor arrangement comprising one or more continuous guard rings, according to some embodiments.
Figure 4:
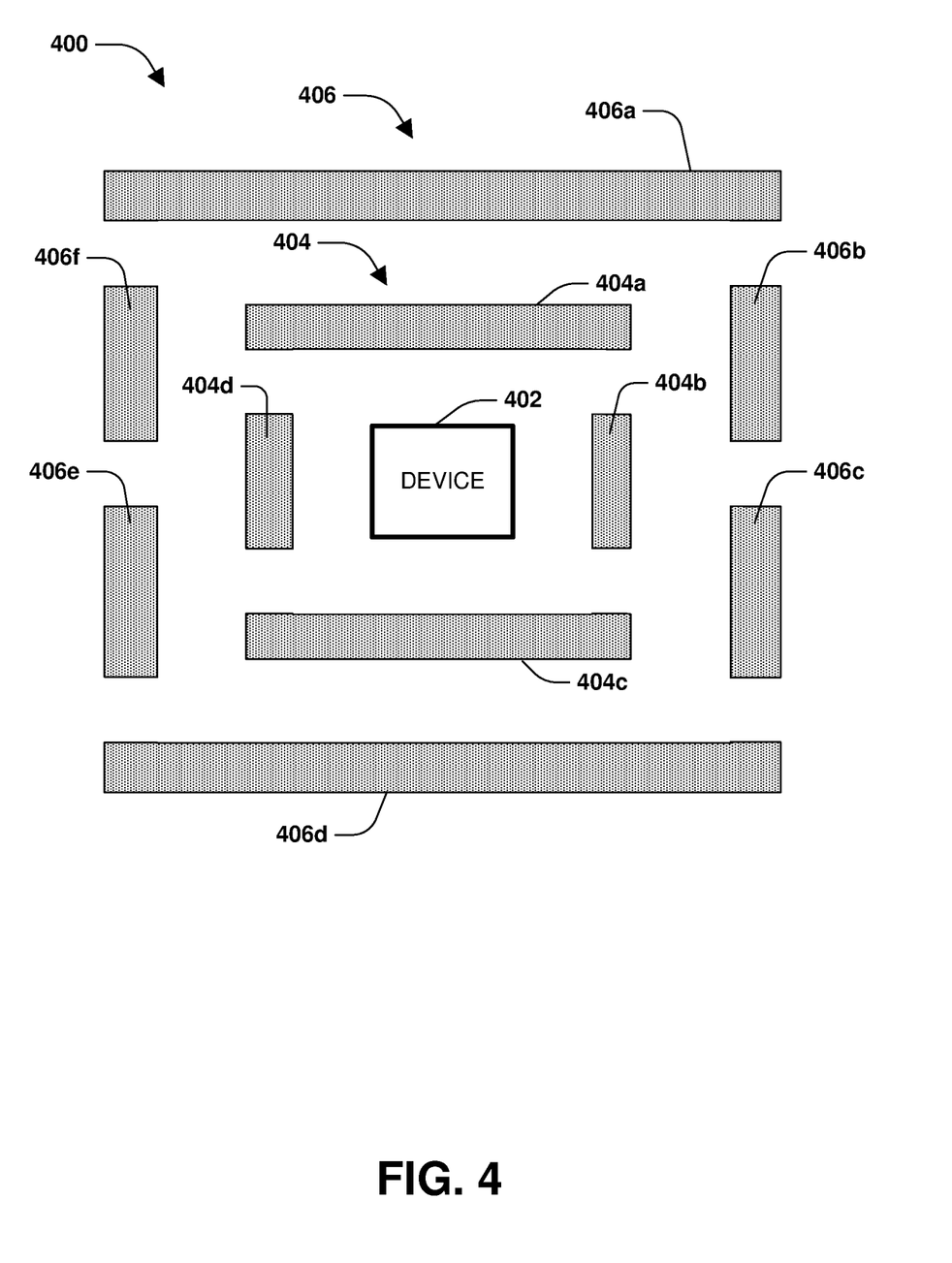
FIG. 4 is an illustration of a semiconductor arrangement comprising one or more discontinuous guard rings, according to some embodiments.

A method 100 of forming a first guard ring is illustrated in FIG. 1. At 102, a doped material layer is formed around at least a portion of a device, such as a FinFET device, of a semiconductor arrangement as a first guard ring. In some embodiments, the doped material layer comprises a doped material, such as doped silicon, an active region material, a diffusion material, an oxide diffusion material, a material utilized for a source or drain region, etc. In some embodiments, the first guard ring provides body-strength, electrical isolation, noise mitigation, etc. for the device. For example, the composition of the first guard ring provides structural integrity that resists forces, such as torque, twisting, vibrations, etc. applied to the semiconductor arrangement and the device. In some embodiments, the composition of the first guard ring has a desired electrical conductivity or non-conductivity to provide a desired electrical isolation for the device. In some embodiments, the first guard ring comprises a single continuous guard ring portion surrounding the device, as illustrated in FIG. 2. For example, FIG. 2 illustrates a first guard ring 204 that is formed around a device 202 of a semiconductor arrangement 200, according to some embodiments. In some embodiments, the first guard ring 204 need not have a square shape around the device 202, but has any other desired shape, such as circular, oval, rectangular, trapezoidal, triangular, octagonal, irregular shape, asymmetric shape, etc. In embodiments, the guard ring comprises one or more discontinuous guard ring portions, such as a first guard ring portion and a second guard ring portion, as illustrated in FIG. 4. For example, FIG. 4 illustrates a first guard ring 404, comprising a first guard ring portion 404a, a second guard ring portion 404b, a third guard ring portion 404c, and a fourth guard ring portion 404d, that is formed around at least a portion of a device 402 of semiconductor arrangement 400, according to some embodiments. In some embodiments, the first guard ring 404 has at least one of a different arrangement of guard ring portions than illustrated in FIG. 4, a different number of guard ring portions than illustrated in FIG. 4, different shaped guard ring portions than illustrated in FIG. 4, etc. In some embodiments, at least one guard ring portion has a different shape than another guard ring portion, such as a first guard ring portion having a rectangular shape and a second guard ring portion having an oval shape, etc.

Figure 3:
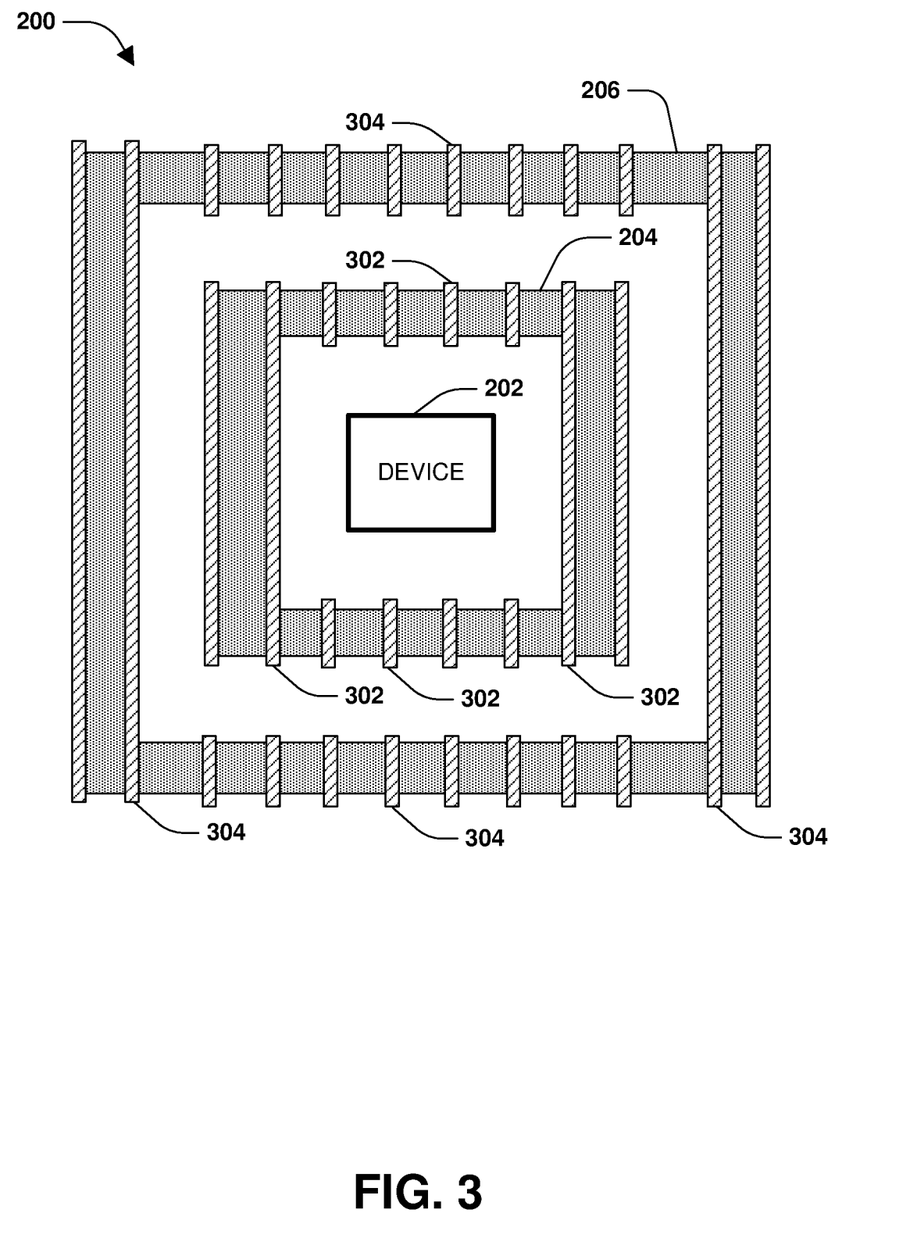
FIG. 3 is an illustration of a semiconductor arrangement comprising one or more poly layers, according to some embodiments.
Figure 5:
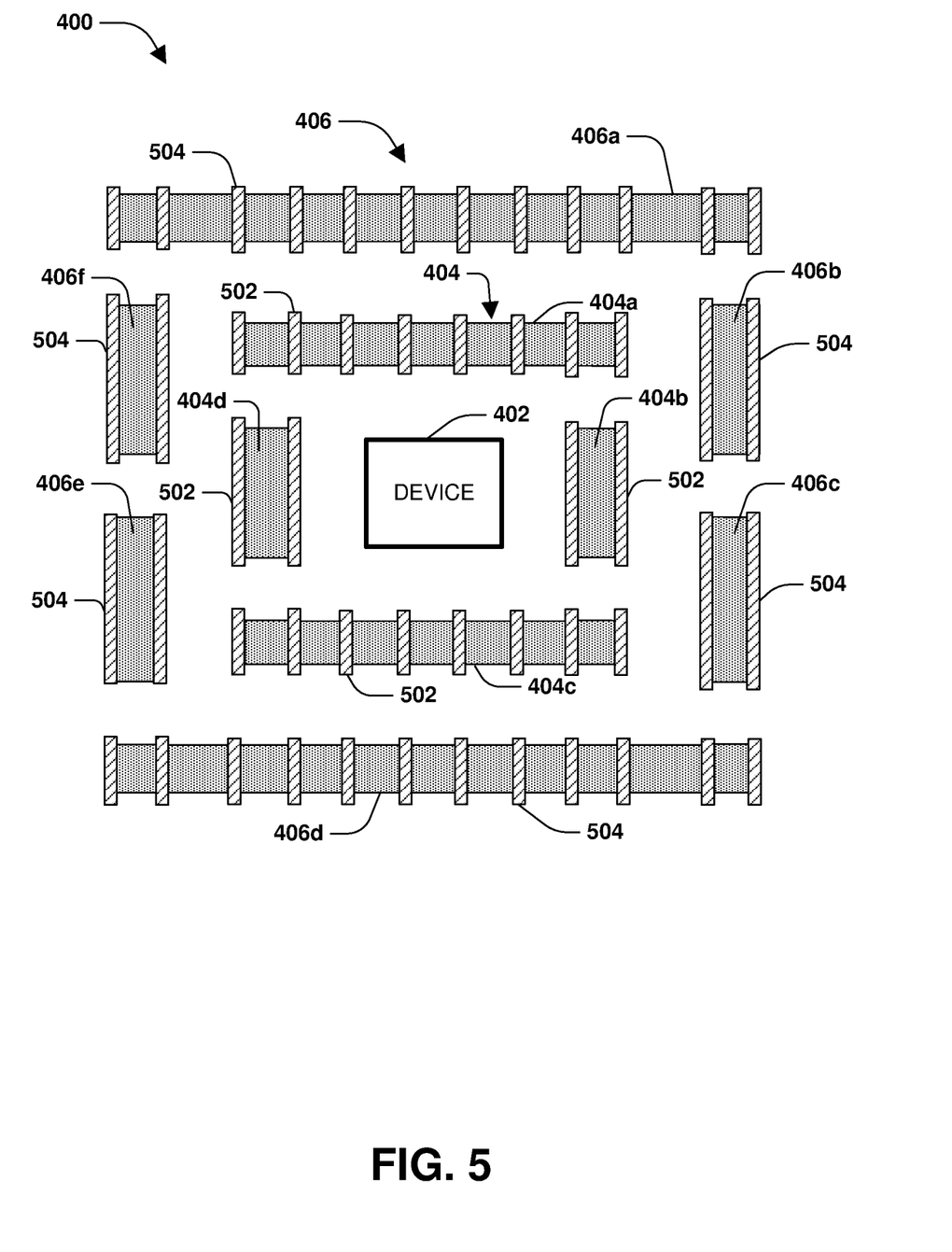
FIG. 5 is an illustration of a semiconductor arrangement comprising one or more poly layers, according to some embodiments.

At 104, a first poly layer is formed over the first guard ring, as illustrated in FIGS. 3 and 5. For example, FIG. 3 illustrates a first poly layer 302 formed over the first guard ring 204, according to some embodiments. In some embodiments, the first poly layer 302 is patterned after being formed, as illustrated in FIG. 3. FIG. 5, for example, illustrates a first poly layer 502 formed over the first guard ring 404, according to some embodiments. In some embodiments, the first poly layer 502 is patterned after being formed, as illustrated in FIG. 5. According to some embodiments, the first poly layer 302 and/or 502 is patterned into one or more poly layer portions, where different poly layer portions have similar or differing sizes, shapes, dimensions, etc. It is appreciated that the first poly layer 302 and/or 502 comprises any number of poly layer portions. In FIG. 5, for example, 8 poly layer portions are formed over the first guard ring portion 404a, 2 poly layer portions are formed over the second guard ring portion 404b, 8 poly layer portions are formed over the third guard ring portion 404c, and 2 poly layer portions are formed over the fourth guard ring portion 404d. In some embodiments, at least one poly layer portion straddles more than one guard ring and/or more than one guard ring portion. For example, a poly layer portion extends between and/or is disposed upon the first guard ring portion 404a and the second guard ring portion 404b, according to some embodiments.

In some embodiments, given that the semiconductor device 202 and/or 402 generally comprises a poly region or poly layer, such as a gate of a transistor device, the first poly layer 302 and/or 502 promotes a more uniform poly density across the semiconductor arrangement 200 and/or 400. For example, in the absence of the first poly layer 302 and/or 502, the first guard ring 204 and/or 404 has a poly density of zero or substantially zero. With the addition of the first poly layer 302 and/or 502, however, the first guard ring 204 and/or 404 has at least some poly, which increases the poly density of the first guard ring 204 and/or 404. The existence of poly in both the semiconductor device 202 and/or 402 and the corresponding first guard ring 204 and/or 404 improves semiconductor processing by inhibiting issues that arise with abrupt changes in materials or structures, such as where the device 202 and/or 402 has a material such as poly, but an adjacent structure such as the first guard ring 204 and/or 404 does not have that material. Without the increased poly density and/or more uniform poly distribution across the semiconductor arrangement 200 and/or 400, the likelihood of processing defects increases. For example, defects such as at least one of film-stress, non-uniform polishing, or reduced poly gate length control are more likely to occur, such as during chemical mechanical polishing. Such defects are likely to adversely affect electrical performance or characteristics or one or more devices of the semiconductor arrangement 200 and/or 400, such as at least one of voltage threshold, saturation current, or circuit mismatch. In some embodiments, the existence of the poly on one or more guard rings satisfies poly uniformity or density criteria regardless of the composition or amount of poly in the device 202 and/or 402, such as where the one or more guard rings, and poly thereon, are distributed around the semiconductor arrangement 200 and/or 400.

In some embodiments, a second guard ring is formed around at least a portion of the device and around at least a portion of the first guard ring, as illustrated in FIGS. 2 and 4. For example, FIG. 2 illustrates a second guard ring 206 formed around the device 202 and around the first guard ring 204, where the second guard ring 206 comprises a single continuous guard ring portion, according to some embodiments. FIG. 4, for example, illustrates a second guard ring 406, comprising a first guard ring portion 406a, a second guard ring portion 406b, a third guard ring portion 406c, a fourth guard ring portion 406d, a fifth guard ring portion 406e, and a sixth guard ring portion 406f, that is formed around at least a portion of the device 402 and around at least a portion of the first guard ring 404, according to some embodiments. As with the first guard ring 204 and/or 404, the second guard ring 206 and/or 406 has any size, shape, arrangement, number of portions, shape of portions, etc., and, in some embodiments provides body-strength, electrical isolation, noise mitigation, etc. for the semiconductor device 202 and/or 402.

A second poly layer is formed over the second guard ring, as illustrated in FIGS. 3 and 5, according to some embodiments. For example, FIG. 3 illustrates a second poly layer 304 formed over the second guard ring 206, according to some embodiments. FIG. 5, for example, illustrates a second poly layer 504 formed over the second guard ring 406, according to some embodiments. As with the first poly layer 302 and/or 502, the second poly layer 304 and/or 504 is patterned into one or more poly layer portions, according to some embodiments, where different poly layer portions have similar or differing sizes, shapes, dimensions, etc. It is appreciated that the second poly layer 304 and/or 504 comprises any number of poly layer portions. In FIG. 5, for example, 12 poly layer portions are formed over the first guard ring portion 406a, 2 poly layer portions are formed over the second guard ring portion 406b, 2 poly layer portions are formed over the third guard ring portion 406c, 12 poly layer portions are formed over the fourth guard ring portion 406d, 2 poly layer portions are formed over the fifth guard ring portion 406e, and 2 poly layer portions are formed over the sixth guard ring portion 406f. As with the first poly layer 302 and/or 502, at least one poly layer portion is associated with more than one guard ring and/or more than one guard ring portion, such as the first guard ring portion 406a and the second guard ring portion 406b, according to some embodiments. As with the first poly layer 302 and/or 502, the second poly layer 304 and/or 504 promotes poly density uniformity across the semiconductor arrangement 200 and/or 400, such as by increasing or establishing an amount of poly in or on the second guard ring 206 and/or 406.

In some embodiments, the first guard ring 204 and/or 404 and the second guard ring 206 and/or 406 are formed from a same layer of material. In some embodiments, the layer of material is patterned to form at least one of the first guard ring 204 and/or 404 or the second guard ring 206 and/or 406 illustrated in at least one of FIG. 3 or FIG. 5. In some embodiments, the first poly layer 302 and/or 502 and the second poly layer 304 and/or 504 are formed from a same layer of poly. In some embodiments, the first guard ring 204 and/or 404 and the second guard ring 206 and/or 406 are formed, and a layer of polysilicon is formed over the first guard ring 204 and/or 404 and the second guard ring 206 and/or 406 to form the first poly layer 302 and/or 502 and the second poly layer 304 and/or 504. In some embodiments, the layer of polysilicon is patterned to form at least one of the first poly layer 302 and/or 502 or the second poly layer 304 and/or 504 as illustrated in at least one of FIG. 3 or FIG. 5. In some embodiments, a poly region or poly layer of the device 202 and/or 402 is formed, such as patterned, from a same layer used to form at least one of the first poly layer 302 and/or 502 or the second poly layer 304 and/or 504 such that characteristics, such as density, thickness, composition, etc., of the poly in the device is substantially similar to corresponding characteristics in at least one of the first poly layer 302 and/or 502 or the second poly layer 304 and/or 504.

In some embodiments, the first guard ring comprises a first doped material having a first doping type such as N-type or P-type. In some embodiments, the second guard ring comprises a second doped material having a second doping type such as N-type or P-type. In some embodiments, the first doping type is different than the second doping type. In some embodiments, at least one of the first guard ring 204 and/or 404 or the second guard ring 206 and/or 406 is connected to a power supply voltage VDD or to ground. According to some embodiments, a connectivity structure, such as one or more of a via, a metal layer, a metal one layer, or a metal structure, is used to connect a guard ring to the power supply voltage VDD or to ground. According to an embodiment, a connectivity structure, such as one or more of a via, a metal layer, a metal one layer, or a metal structure, is used to connect a first guard ring portion to a second guard ring portion.

Figure 6:
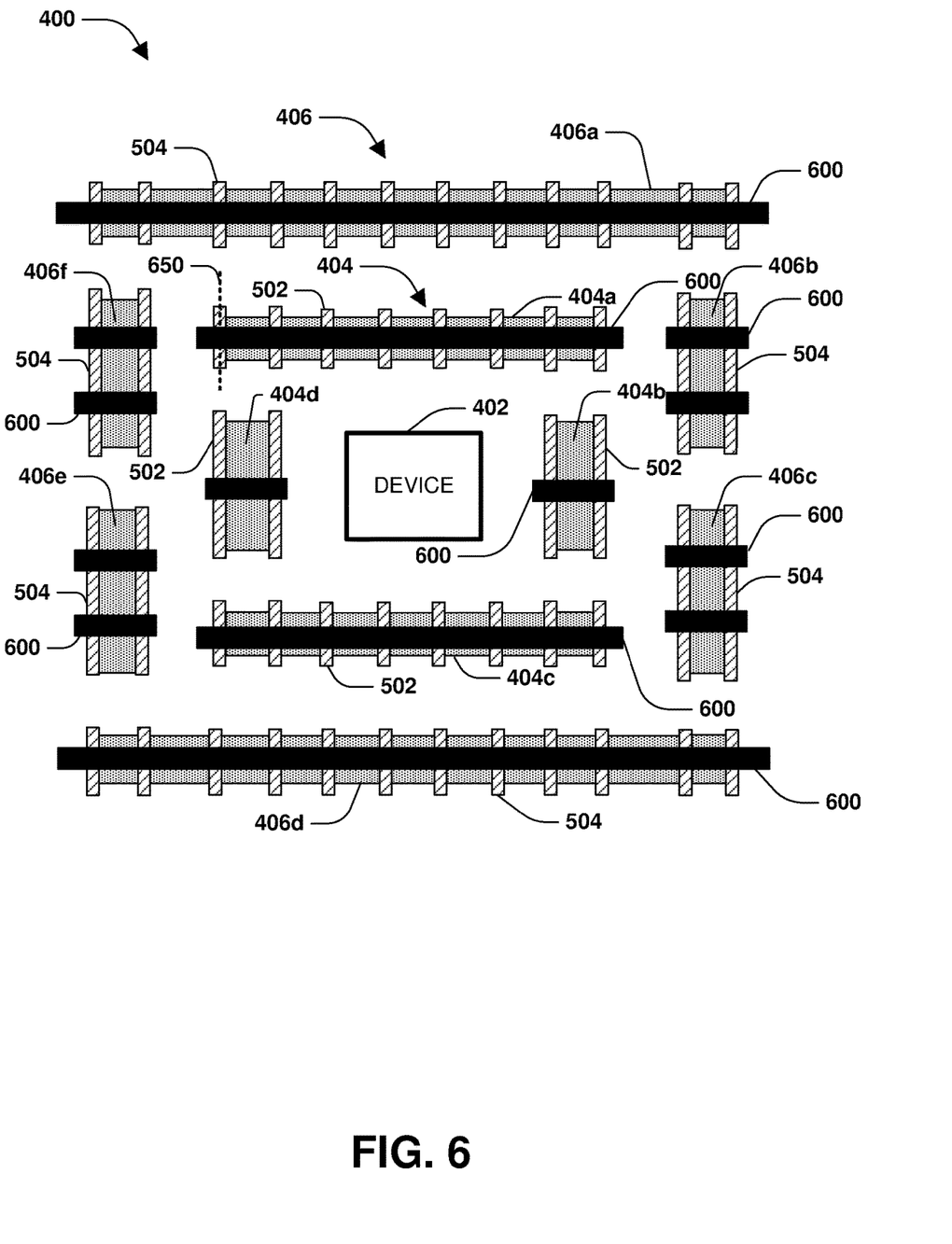
FIG. 6 is an illustration of a semiconductor arrangement comprising a metal layer, according to some embodiments.

In some embodiments, a metal layer 600 is formed within the semiconductor arrangement 400, as illustrated in FIG. 6. In some embodiments, the metal layer 600 is patterned so as to be formed according to a horizontal structure relative to a surface of a substrate upon which the semiconductor arrangement 400 is formed, such as a horizontal direction that is different from a vertical direction according to which poly layer portions of the first poly layer 502 or poly layer portions of the second poly layer 504 are formed. In some embodiments, the metal layer 600 is formed to connect a first guard ring portion of a guard ring to a second guard ring portion of the guard ring. In some embodiments, the metal layer 600 is formed to connect a guard ring to a power supply voltage VDD or to ground, such as through a via connected to the metal layer 600. In some embodiments, the metal layer 600 comprises a conductive material, such as a metal, a doped material, a material formed by poly process, a first metal layer, or other suitable material. The metal layer 600 serves as a metal routing layer according to some embodiments. In some embodiments, the metal layer 600 is connected to or is separate from at least one of the first guard ring 404 or the second guard ring 406. In some embodiments, the metal layer 600, and not a metal one layer, is used to bias a guard ring, which frees up routing resources and space that would otherwise be used by the metal one layer for biasing.

Figure 7:
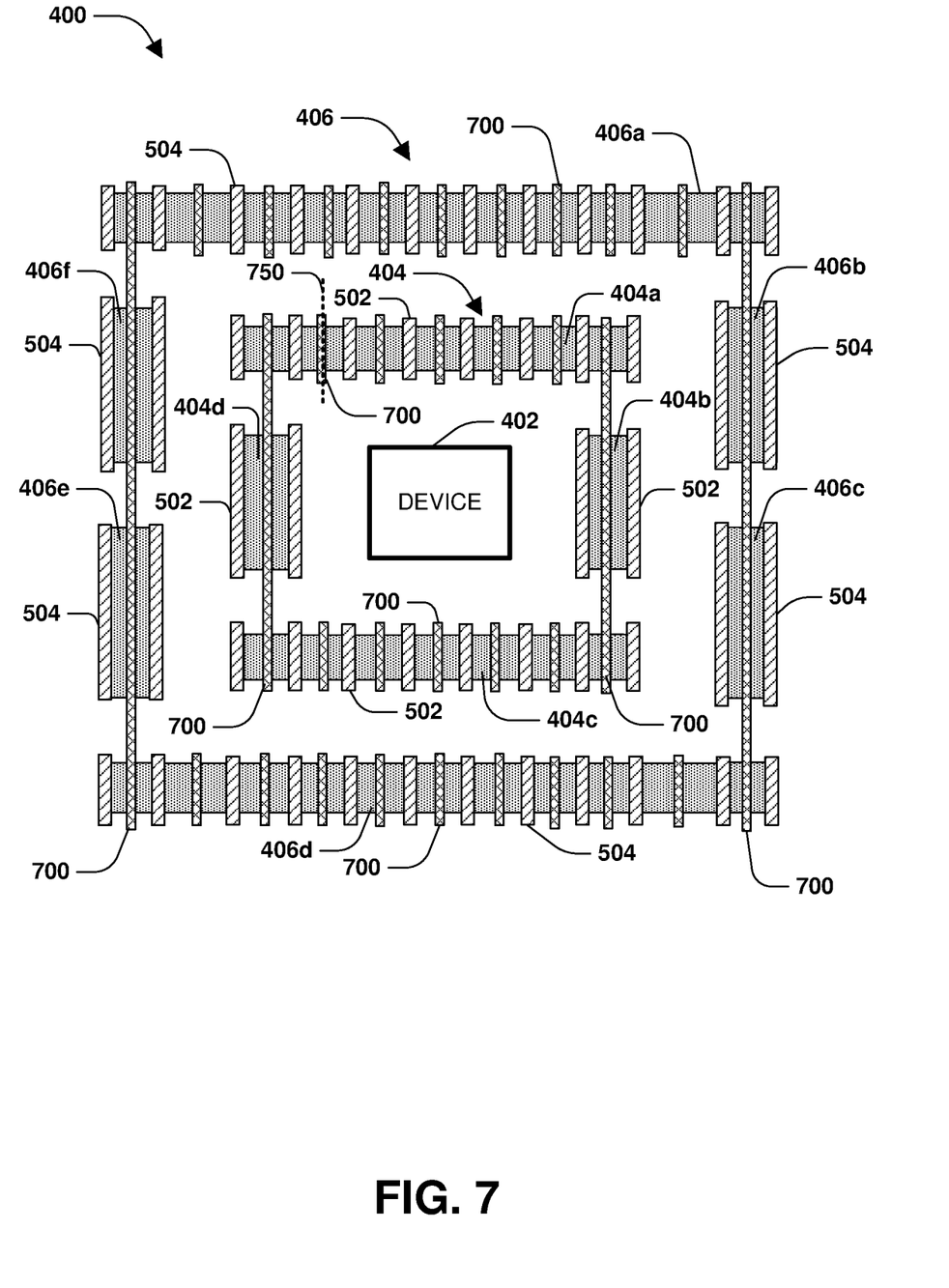
FIG. 7 is an illustration of a semiconductor arrangement comprising a metal one layer, according to some embodiments.

In some embodiments, a metal one layer 700 is formed within the semiconductor arrangement 400, as illustrated in FIG. 7. In some embodiments, the metal one layer 700 comprises one or more layers of conductive material. In some embodiments, the metal one layer 700 is patterned so as to be formed according to a vertical structure relative to the surface of the substrate upon which the semiconductor arrangement 400 is formed, such as a vertical direction similar to the vertical direction according to which poly layer portions of the first poly layer 502 or poly layer portions of the second poly layer 504 are formed. In some embodiments, the metal one layer 700 is formed to connect a first guard ring portion of a guard ring to a second guard ring portion of the guard ring, such as connecting the first guard ring portion 404a, the second guard ring portion 404b, and the third guard ring portion 404c of the first guard ring 404. In some embodiments, the metal one layer 700 is formed to connect a guard ring to a power supply voltage VDD or to ground, such as through a via connected to the metal one layer 700. In some embodiments, the metal one layer 700 comprises a conductive material, such as a metal, a doped material, a material formed by poly process, or other suitable material. The metal one layer 700 serves as a metal routing layer according to some embodiments. In some embodiments, the metal one layer 700 is connected to or is separate from at least one of the first guard ring 404 or the second guard ring 406. In some embodiments, the metal layer 600 is formed over the metal one layer 700, and the metal layer 600 connects to metal one portions of the metal one layer 700 so that such metal one portions have a similar voltage potential. In some embodiments, the first guard ring 404 is illustrative of a metal-oxide-semiconductor (MOS) device layout because the first guard ring 404 is formed with the doped material layer, the first poly layer 502, the metal layer 600, and the metal one layer 700.

Figure 8A:
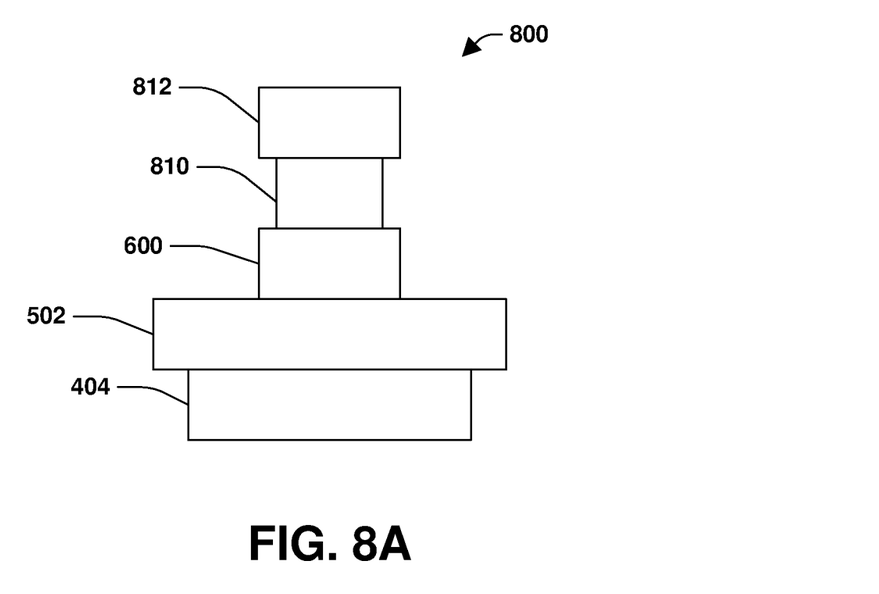
FIG. 8A is an illustration of a cross sectional view of a semiconductor arrangement, according to some embodiments.

FIG. 8A illustrates a cross sectional view 800 taken along a line 650 of FIG. 6. The cross sectional view 800 illustrates the first guard ring 404 with the first poly layer 502 over the first guard ring 404, and the metal layer 600 over the first poly layer 502. According to some embodiments, a via 810 is formed over the metal layer 600, and is used to connect the metal layer 600 to another metal layer 812, such as a metal one layer. In some embodiments, the metal layer 600 and the via 810 are regarded as a connectivity structure that connects the first poly layer 502 and the first guard ring 404 to the metal layer 812.

Figure 8B:
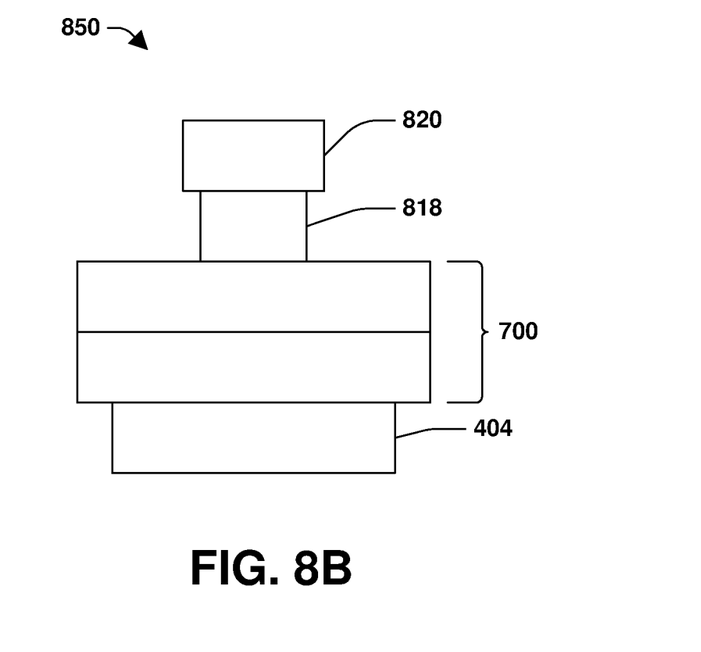
FIG. 8B is an illustration of a cross sectional view of a semiconductor arrangement, according to some embodiments.

FIG. 8B illustrates a cross sectional view 850 taken along a line 750 of FIG. 7. The cross sectional view 850 illustrates the first guard ring 404 with the metal one layer 700 over the first guard ring 404. According to some embodiments, a via 818 is formed over the metal one layer 700, and is used to connect the metal one layer 700 to a metal layer 820. In some embodiments, the via 818 is regarded as a connectivity structure that connects the metal one layer 700 and the first guard ring 404 to the metal layer 820.

In some embodiments, a semiconductor arrangement as described herein is formed as part of a complementary metal oxide semiconductor (CMOS) fabrication process. In some embodiments, as the semiconductor device is formed, the guard rings, and poly formed thereover, are formed as well. For example, where the device comprises a transistor, the poly is formed over the guard rings when a poly gate of the transistor is formed. For example, a single layer of polysilicon is formed and then patterned to form the poly gate of the transistor as well as the poly over the guard rings.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure. Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, elements, etc., mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others of ordinary skill in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a semiconductor arrangement is provided. The semiconductor arrangement comprises a first guard ring surrounding at least a portion of a device, according to some embodiments. A first poly layer is formed over the first guard ring, according to some embodiments.

According to an aspect of the instant disclosure, a method for forming a first guard ring is provided. The method comprises forming a doped material layer around at least a portion of a device of a semiconductor arrangement as a first guard ring, according to some embodiments. A first poly layer is formed over the first guard ring, according to some embodiments.

According to an aspect of the instant disclosure, a semiconductor arrangement is provided. The semiconductor arrangement comprises a first doped material guard ring surrounding at least a portion of a device, according to some embodiments. A first poly layer is formed over the first doped material guard ring, according to some embodiments. A metal layer is formed over the first poly layer, according to some embodiments. A second metal layer is connected to the metal layer by a via, according to some embodiments.

What is claimed is:

1. A method for forming a semiconductor arrangement, comprising:
    forming a first guard ring portion of a first guard ring and a second guard ring portion of the first guard ring to surround at least a portion of a device, wherein the second guard ring portion is discontinuous from the first guard ring portion;
    forming a first poly portion of a poly layer over the first guard ring portion; and
    forming a first metal portion of a metal layer adjacent the first poly portion and over the first guard ring portion and the second guard ring portion to couple the first guard ring portion to the second guard ring portion.

2. The method of claim 1, comprising:
    forming a second poly portion of the poly layer over the second guard ring portion, wherein the first poly portion extends in a first direction and the second poly portion extends in the first direction.

3. The method of claim 2, wherein:
    forming the first guard ring portion comprises forming the first guard ring portion to extend in the first direction, and forming the second guard ring portion comprises forming the second guard ring portion to extend in a second direction different than the first direction.

4. The method of claim 3, wherein the second direction is perpendicular to the first direction.

5. The method of claim 2, wherein forming the first metal portion comprises forming the first metal portion to extend in the first direction.

6. The method of claim 1, comprising:
forming a second poly portion of the poly layer over the first guard ring portion;
forming a third poly portion of the poly layer over the second guard ring portion; and
forming a fourth poly portion of the poly layer over the second guard ring portion, wherein forming the first metal portion comprises forming the first metal portion between the first poly portion and the second poly portion and between the third poly portion and the fourth poly portion.

7. The method of claim 1, comprising:
forming a second poly portion of the poly layer over the first guard ring portion and spaced apart from the first poly portion; and
forming a second metal portion of a second metal layer over the first poly portion and the second poly portion.

8. The method of claim 7, wherein:
forming the first poly portion comprises forming the first poly portion to extend in a first direction,
forming the second poly portion comprises forming the second poly portion to extend in the first direction, and
forming second metal portion to extend in a second direction.

9. The method of claim 8, wherein the second direction is perpendicular to the first direction.

10. The method of claim 1, comprising:
forming a second guard ring surrounding at least a portion of the first guard ring.

11. The method of claim 10, comprising:
doping the first guard ring with a first dopant having a first doping type; and
doping the second guard ring with a second dopant having a second doping type different than the first doping type.

12. A method for forming a semiconductor arrangement, comprising:
forming a first guard ring portion of a first guard ring and a second guard ring portion of the first guard ring to surround at least a portion of a device, wherein the second guard ring portion is discontinuous from the first guard ring portion;
forming a first poly portion of a poly layer over the first guard ring portion and extending in a first direction; and
forming a first metal portion of a first metal layer over the first poly portion and extending in a second direction different than the first direction.

13. The method of claim 12, wherein the second direction is perpendicular to the first direction.

14. The method of claim 12, comprising:
forming a second metal portion of a second metal layer to couple the first guard ring portion to the second guard ring portion.

15. The method of claim 14, wherein forming the second metal portion comprises forming the second metal portion adjacent to the first poly portion and extending in the first direction.

16. A method for forming a semiconductor arrangement, comprising:
forming a first guard ring;
forming a first poly portion of a first poly layer to contact the first guard ring and a second poly portion of the first poly layer to contact the first guard ring, wherein the first poly portion is spaced apart from and discontinuous from the second poly portion; and
forming a first metal portion of a first metal layer over the first poly portion and the second poly portion to couple the first poly portion to the second poly portion.

17. The method of claim 16, wherein forming the first guard ring comprises forming the first guard ring as a closed loop.

18. The method of claim 16, wherein forming the first guard ring comprises forming a first guard ring portion and a second guard ring portion spaced apart from and discontinuous from the first guard ring portion.

19. The method of claim 18, comprising:
forming a second metal portion of a second metal layer to couple the first guard ring portion to the second guard ring portion.

20. The method of claim 19, wherein the second metal portion is between the first poly portion and the second poly portion.

* * * * *